United States Patent
Zhang et al.

(10) Patent No.: US 10,784,900 B2
(45) Date of Patent: Sep. 22, 2020

(54) RATE MATCHING METHOD AND APPARATUS FOR POLAR CODE

(71) Applicant: Huawei Technologies Co., Ltd., Shenzhen, Guangdong, P.R. (CN)

(72) Inventors: Gongzheng Zhang, Hangzhou (CN); Ying Chen, Hangzhou (CN); Rong Li, Hangzhou (CN); Chaolong Zhang, Hangzhou (CN); Yourui Huangfu, Hangzhou (CN); Huazi Zhang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/272,937

(22) Filed: Feb. 11, 2019

(65) Prior Publication Data
US 2019/0173491 A1 Jun. 6, 2019

Related U.S. Application Data

(63) Continuation of application No. PCT/CN2017/091057, filed on Jun. 30, 2017.

(30) Foreign Application Priority Data

Aug. 11, 2016 (CN) .......................... 2016 1 0664998

(51) Int. Cl.
*H03M 13/00* (2006.01)
*H03M 13/13* (2006.01)
*H03M 13/29* (2006.01)

(52) U.S. Cl.
CPC ....... *H03M 13/6362* (2013.01); *H03M 13/13* (2013.01); *H03M 13/2903* (2013.01); *H03M 13/616* (2013.01)

(58) Field of Classification Search
CPC ........... H03M 13/6362; H03M 13/616; H03M 13/2903; H03M 13/13; H04L 1/0067; H04L 1/0057
See application file for complete search history.

(56) References Cited

U.S. PATENT DOCUMENTS

2014/0108748 A1   4/2014 Lee et al.
2015/0333769 A1  11/2015 Jeong et al.
(Continued)

FOREIGN PATENT DOCUMENTS

CA    2972832 A1    7/2015
CN  103023618 A    4/2013
(Continued)

OTHER PUBLICATIONS

X. Lv, R. Liu and R. Wang, "A Novel Rate-Adaptive Distributed Source Coding Scheme Using Polar Codes," in IEEE Communications Letters, vol. 17, No. 1, pp. 143-146, Jan. 2013. (Year: 2013).*

(Continued)

*Primary Examiner* — Cynthia Britt
(74) *Attorney, Agent, or Firm* — Slater Matsil, LLP

(57) ABSTRACT

A rate matching method for a polar code is provided, to improve performance. The method includes: encoding, based on an N*N encoding matrix of a polar code, a sequence including N first bits, to generate a mother code including N second bits, where the N first bits are in a one-to-one correspondence with N rows in the encoding matrix in sequence, and the N second bits are in a one-to-one correspondence with N columns in the encoding matrix in sequence; determining N–M to-be-punctured second bits from the N second bits, where at least one first bit in N–M first bits participating in encoding of the N–M second bits belongs to the first M first bits in the N first bits, and the N–M first bits are fixed bits; and puncturing the N–M second bits, to obtain a target polar code including M second bits.

18 Claims, 6 Drawing Sheets

(56) References Cited

U.S. PATENT DOCUMENTS

| | | | |
|---|---|---|---|
| 2016/0182187 A1 | 6/2016 | Kim et al. | |
| 2016/0285479 A1* | 9/2016 | El-Khamy | H03M 13/616 |
| 2016/0308644 A1* | 10/2016 | Shen | H04L 1/1819 |
| 2017/0331590 A1* | 11/2017 | Wu | H04L 1/0041 |
| 2018/0026663 A1* | 1/2018 | Wu | H03M 13/6362 |
| | | | 714/776 |
| 2019/0245654 A1* | 8/2019 | Richardson | H03M 13/6306 |

FOREIGN PATENT DOCUMENTS

| | | |
|---|---|---|
| WO | 2015100561 A1 | 7/2015 |
| WO | 2015100572 A1 | 7/2015 |

OTHER PUBLICATIONS

H. Vangala, E. Viterbo and Y. Hong, "Permuted successive cancellation decoder for polar codes," 2014 International Symposium on Information Theory and its Applications, Melbourne, VIC, 2014, pp. 438-442. (Year: 2014).*

Wang, Runxin, et al., "A Novel Puncturing Scheme for Polar Codes", IEEE Communications Letters, vol. 18, No. 12, Dec. 2014, pp. 2081-2084, XP011567208.

Mediatek Inc., "Discussion on Polar Code Design and Performance", 3GPP TSG RAN WG1 Meeting #85bis, R1-166454, Nanjing, China, May 23-27, 2016, XP051104208, 8 pages.

Mediatek Inc., "Discussion on Polar Code Design and Performance", 3GPP TSG RAN WG1 Meeting #85bis, R1-165454, Nanjing, China, May 23-27, 2016, 7 pages.

Qualcomm Incorporated, "Polar code design overview", 3GPP TSG-RAN WG1 #85, R1-164699, Nanjing, China, May 23-27, 2016, 3 pages.

\* cited by examiner

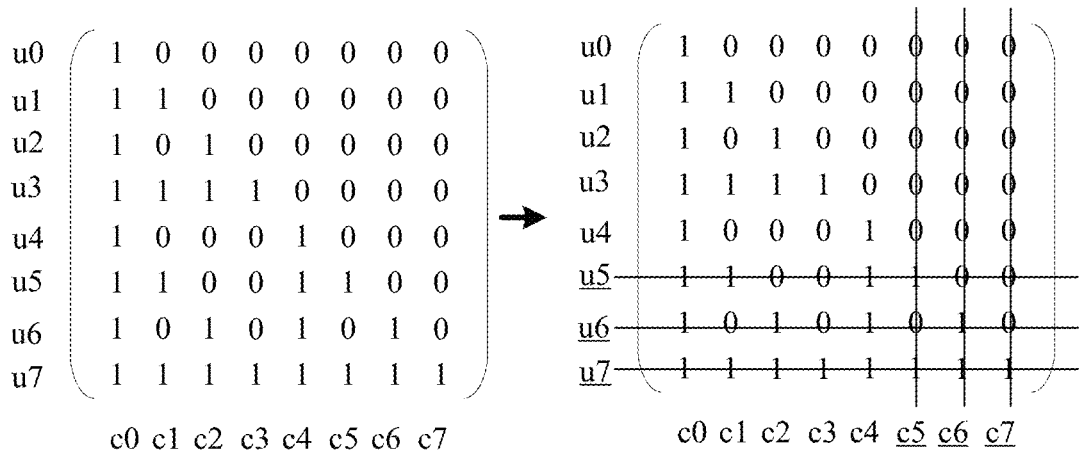

FIG. 1

200 — Encode, based on an N*N encoding matrix of a polar code, a sequence including N first bits, to generate a mother code including N second bits, where the N first bits are in a one-to-one correspondence with N rows in the encoding matrix in sequence, and the N second bits are in a one-to-one correspondence with N columns in the encoding matrix in sequence — S201

Determine N–M to-be-punctured second bits from the N second bits, where at least one first bit in N–M first bits participating in encoding of the N–M second bits belongs to the first M first bits in the N first bits, and the N–M first bits are fixed bits — S202

Puncture the N–M second bits, to obtain a target polar code including M second bits — S203

FIG. 2

$$\begin{array}{c}u0\\u1\\u2\\u3\\u4\\u5\\u6\\u7\end{array}\begin{pmatrix}1&0&0&0&0&0&0&0\\1&1&0&0&0&0&0&0\\1&0&1&0&0&0&0&0\\1&1&1&1&0&0&0&0\\1&0&0&0&1&0&0&0\\1&1&0&0&1&1&0&0\\1&0&1&0&1&0&1&0\\1&1&1&1&1&1&1&1\end{pmatrix}\rightarrow\begin{pmatrix}1&0&0&0&0&0&0&0\\1&1&0&0&0&0&0&0\\1&0&1&0&0&0&0&0\\1&1&1&0&0&0&0&0\\1&0&0&0&1&0&0&0\\1&1&0&0&1&0&0&0\\1&0&1&0&1&0&1&0\\1&1&1&1&1&1&1&1\end{pmatrix}$$

$$\quad\quad\quad\text{c0 c1 c2 c3 c4 c5 c6 c7}\quad\quad\quad\quad\quad\text{c0 c1 c2 } \underline{c3}\text{ c4 }\underline{c5}\text{ c6 }\underline{c7}$$

FIG. 3

$$I_8=\begin{pmatrix}1&0&0&0&0&0&0&0\\0&1&0&0&0&0&0&0\\0&0&1&0&0&0&0&0\\0&0&0&1&0&0&0&0\\0&0&0&0&1&0&0&0\\0&0&0&0&0&1&0&0\\0&0&1&0&0&0&1&0\\0&0&0&0&0&0&0&1\end{pmatrix}\rightarrow B_8=\begin{pmatrix}1&0&0&0&0&0&0&0\\0&0&0&0&1&0&0&0\\0&0&1&0&0&0&0&0\\0&0&0&0&0&0&1&0\\0&1&0&0&0&0&0&0\\0&0&0&0&0&1&0&0\\0&0&0&1&0&0&0&0\\0&0&0&0&0&0&0&1\end{pmatrix}$$

$$\quad\quad\quad 0\ 1\ 2\ 3\ 4\ 5\ 6\ 7 \quad\quad\quad\quad\quad 0\ 4\ 2\ 6\ 1\ 5\ 3\ 7$$

FIG. 4

$$\begin{array}{c}u0\\u1\\u2\\u3\\u4\\u5\\u6\\u7\end{array}\begin{pmatrix}1&0&0&0&0&0&0&0\\1&0&0&0&1&0&0&0\\1&0&1&0&0&0&0&0\\1&0&1&0&1&0&1&0\\1&1&0&0&0&0&0&0\\1&1&0&0&1&1&0&0\\1&1&1&1&0&0&0&0\\1&1&1&1&1&1&1&1\end{pmatrix}\rightarrow\begin{pmatrix}1&0&0&0&0&0&0&0\\1&0&0&0&1&0&0&0\\1&0&1&0&0&0&0&0\\1&0&1&0&1&0&1&0\\1&1&0&0&0&0&0&0\\1&1&0&0&1&0&0&0\\1&1&1&1&0&0&0&0\\1&1&1&1&1&1&1&1\end{pmatrix}$$

$$\quad\quad\quad\text{c0 c1 c2 c3 c4 c5 c6 c7}\quad\quad\quad\quad\quad\text{c0 c1 c2 c3 c4 }\underline{c5}\ \underline{c6}\ \underline{c7}$$

RATE MATCHING METHOD AND APPARATUS FOR POLAR CODE

CROSS-REFERENCE TO RELATED APPLICATIONS

This application is a continuation of International Application No. PCT/CN2017/091057 filed on Jun. 30, 2017, which claims priority to Chinese Patent Application No. 201610664998.4 filed on Aug. 11, 2016. The disclosures of the aforementioned applications are hereby incorporated by reference in their entireties.

TECHNICAL FIELD

This application relates to the communications field, and in particular, to a rate matching method and apparatus for a polar code.

BACKGROUND

In a communications system, channel coding is usually used to improve reliability of data transmission and ensure communication quality. A polar code is an encoding manner that can achieve a Shannon capacity and that has low coding-decoding complexity. The polar code is a linear block code, an encoding matrix of the polar code is $G_N$, and an encoding process of the polar code is $c_1^N = u_1^N G_N$, where $u_1^N = (u_1, u_2, \ldots, u_N)$ is a binary row vector of length N, $G_N$ is an N×N matrix, $G_N = F_2^{\otimes(\log_2(N))}$, or $G_N = B_N F_2^{\otimes(\log_2(N))}$, $$F_2 = \begin{bmatrix} 1 & 0 \\ 1 & 1 \end{bmatrix},$$

$F_2^{\otimes(\log_2(N))}$ is defined as a Kronecker product of $\log_2 N$ matrices $F_2$, and $B_N$ is a bit-reversal permutation matrix.

In the encoding process of the polar code, some bits in $u_1^N$ are used to carry information and are referred to as information bits, and a set of indexes of these bits is denoted as A. The other bits in $u_1^N$ are set to fixed values pre-agreed on by a receive end and a transmit end, and are referred to as fixed bits, and a set of indexes of the fixed bits is represented by a complementary set $A^c$ of A. Without loss of generality, the fixed bits are usually set to 0. A sequence of the fixed bits may be set to any values provided that the receive end and the transmit end pre-agree with each other. Therefore, encoding output of the polar code may be simplified as: $c_1^N = u_A G_N(A)$, where $u_A$ is a set of information bits in $u_1^N$, and $u_A$ is a row vector of length K, to be specific, |A|=K, where |·| represents a quantity of elements in a set, and K is a size of an information block; and $G_N(A)$ is a submatrix including rows corresponding to the indexes in the set A in the matrix $G_N$, and $G_N(A)$ is a K×N matrix. A construction process of the polar code is a selection process of the set A, and determines performance of the polar code. It can be learned from the encoding matrix that, a code length of an original polar code is an integral power of 2. During actual application, rate matching is required to generate a polar code of any code length.

In the prior art, an encoding and rate matching solution for a polar code is usually implemented by shortening the polar code. In this solution, $c_1^N = u_1^N G_N$, and an encoding matrix is $G_N = F_2^{\otimes(\log_2(N))}$. It is assumed that $u_1^N$ includes N first bits (to-be-coded bits), and $c_1^N$ includes N second bits (coded bits). First, reliability of a polarized channel corresponding to each first bit is calculated. Common measurements of reliability include an error probability, a channel capacity, a polarization weight, and the like. Methods for calculating reliability of a polarized channel include density evolution (DE), Gaussian approximation (GA), and linear fitting. Then, a puncturing pattern is determined (to be specific, a position of a to-be-punctured second bit and a position of a corresponding polarized channel are determined, and polarized channels are in a one-to-one correspondence with the N first bits in sequence), and a fixed bit is placed on a polarized channel corresponding to a puncturing position. Finally, positions of information bits and fixed bits are determined on the remaining polarized channels based on the reliability. FIG. 1 is a schematic diagram of puncturing when $N=2^3$, where a target code length M=5. As shown in FIG. 1, generally, because the encoding matrix $G_N$ is a lower triangular matrix, N–M second bits corresponding to the last N–M (in FIG. 1, N–M=3) columns in the encoding matrix may be punctured, and fixed bits in the N first bits are placed on the last N–M polarized channels. In this way, punctured bits are related only to fixed bits, and this is a feasible puncturing pattern. However, generally, a polarized channel whose sequence number is larger has higher reliability, and if a fixed bit is placed on the polarized channel, performance may be unstable, and performance of the polar code is affected.

SUMMARY

This application provides a rate matching method and apparatus for a polar code, to improve performance of the polar code.

According to a first aspect, a rate matching method for a polar code is provided, including: encoding, based on an N*N encoding matrix of a polar code, a sequence including N first bits, to generate a mother code including N second bits, where the N first bits are in a one-to-one correspondence with N rows in the encoding matrix in sequence, and the N second bits are in a one-to-one correspondence with N columns in the encoding matrix in sequence; determining N–M to-be-punctured second bits from the N second bits, where at least one first bit in N–M first bits participating in encoding of the N–M second bits belongs to the first M first bits in the N first bits, and the N–M first bits are fixed bits; and puncturing the N–M second bits, to obtain a target polar code including M second bits.

In this embodiment of this application, when a puncturing length of the polar code is N–M, the at least one first bit in the N–M first bits participating in the encoding of the N–M to-be-punctured second bits belongs to the first M first bits in the N first bits, and the N–M first bits are fixed bits, in other words, information bits other than the fixed bits may be placed on polarized channels that correspond to the last N–M rows in the encoding matrix and that have relatively high reliability, to improve performance of the polar code.

In a possible implementation, the encoding matrix is $G_N$, where $G_N = F_2^{\otimes(\log_2(N))}$, $$F_2 = \begin{bmatrix} 1 & 0 \\ 1 & 1 \end{bmatrix},$$

and $F_2^{\otimes(\log_2(N))}$ represents a Kronecker product of $\log_2 N$ matrices $F_2$.

In a possible implementation, sequence numbers of the N–M second bits are the same as values of elements in a second sequence, the second sequence is a sequence of bit-reversal values of values of elements in a first sequence, and the first sequence is $$\Big(\underbrace{M, M+1, \ldots, N-1}_{N-M}\Big).$$

In a possible implementation, sequence numbers of the N−M second bits are the same as sequence numbers of the first N−M elements whose values are in descending order in a fourth sequence, the fourth sequence is a sequence of bit-reversal values of values of elements in a third sequence, and the third sequence is $$\Big(\underbrace{0, 1, \ldots, N-1}_{N}\Big).$$

In a possible implementation, sequence numbers of the N−M second bits are the same as sequence numbers of elements whose values are 0 in a second auxiliary sequence $p_0^{N-1}$, where the second auxiliary sequence $p_0^{N-1}$ and a first auxiliary sequence $$q_0^{N-1} = \Big(\underbrace{1, 1, \ldots, 1}_{M}, \underbrace{0, 0, \ldots, 0}_{N-M}\Big)$$

meet a formula $p_i = p_{D(b_{n-1}b_{n-2}\ldots b_0)} = q_{D(b_0b_1\ldots b_{n-1})}$, $p_i$ represents a value of an $i^{th}$ element in the second auxiliary sequence, $i = D(b_{n-1}b_{n-2}\ldots b_0)$, $$D(b_{n-1}b_{n-2}\ldots b_0) = \sum_{j=0}^{n-1} b_j \cdot 2^j,$$

$0 \leq i \leq N-1$, $N = 2^n$, and $b_j$ is a binary number.

In a possible implementation, the encoding matrix is $G_N$, where $G_N = B_N F_2^{\otimes (log_2(N))}$, $$F_2 = \begin{bmatrix} 1 & 0 \\ 1 & 1 \end{bmatrix},$$

$F_2^{\otimes (log_2(N))}$ represents a Kronecker product of $log_2 N$ matrices $F_2$, $B_N$ is a bit-reversal permutation matrix, and the N−M second bits are in a one-to-one correspondence with the last N−M columns in the encoding matrix.

In a possible implementation, the N−M second bits are sequentially determined based on N−M rounds of operations. The first round of operation in the N−M rounds of operations includes: determining a second bit corresponding to an $N^{th}$ column in the N columns as a to-be-punctured second bit. The $(j+1)^{th}$ round of operation in the N−M rounds of operations includes: determining an (N−j)*(N−j) auxiliary encoding matrix, where the auxiliary encoding matrix is a matrix obtained after rows and columns corresponding to to-be-punctured second bits determined in the first j rounds are deleted from the encoding matrix, and $1 \leq j \leq N-M-1$; determining candidate columns from N−j columns in the auxiliary encoding matrix, where the candidate column includes only one element whose value is 1; determining a target column from the candidate columns; and determining a second bit corresponding to the target column as the to-be-punctured second bit.

In a possible implementation, the determining a target column from the candidate columns includes: determining a candidate column whose sequence number is the smallest in the candidate columns as the target column.

In a possible implementation, the determining a target column from the candidate columns includes: determining a code weight of a row corresponding to each of the candidate columns, where the row corresponding to each candidate column is a row in which an element whose value is 1 in each candidate column is located; and determining a candidate column corresponding to a row whose code weight is the smallest in the candidate columns as the target column.

In a possible implementation, the determining a target column from the candidate columns includes: determining a polarization weight of a row corresponding to each of the candidate columns, where the row corresponding to each candidate column is a row in which an element whose value is 1 in each candidate column is located; and determining a candidate column corresponding to a row whose polarization weight is the smallest in the candidate columns as the target column.

According to a second aspect, an apparatus is provided. The apparatus includes a module configured to perform the method in the first aspect. The apparatus and the method in the first aspect are based on a same inventive concept, and a problem-resolving principle of the apparatus corresponds to the solution in the method design in the first aspect. Therefore, for implementation of the apparatus, refer to implementation of the method, and no repeated description is provided.

According to a third aspect, an apparatus is provided. The apparatus includes a memory, a processor, and a transceiver. The memory is configured to store a program, the processor is configured to execute the program, and the transceiver is configured to communicate with another device. When the program is executed, the processor is configured to perform the method in the first aspect.

According to a fourth aspect, a system chip is provided. The system chip includes a module configured to perform the method in the first aspect.

BRIEF DESCRIPTION OF THE DRAWINGS

FIG. 1 is a schematic diagram of a rate matching method for a polar code according to an embodiment of this application;

FIG. 2 is a schematic flowchart of a rate matching method for a polar code according to an embodiment of this application;

FIG. 3 is a schematic diagram of a rate matching method for a polar code according to another embodiment of this application;

FIG. 4 is a schematic diagram of a bit-reversal permutation matrix according to another embodiment of this application;

FIG. 5 is a schematic diagram of a rate matching method for a polar code according to still another embodiment of this application;

FIG. 8 is a schematic diagram of a rate matching method for a polar code according to yet another embodiment of this application;

FIG. 9 is a schematic block diagram of an apparatus according to an embodiment of this application.

DETAILED DESCRIPTION

Figure 6:
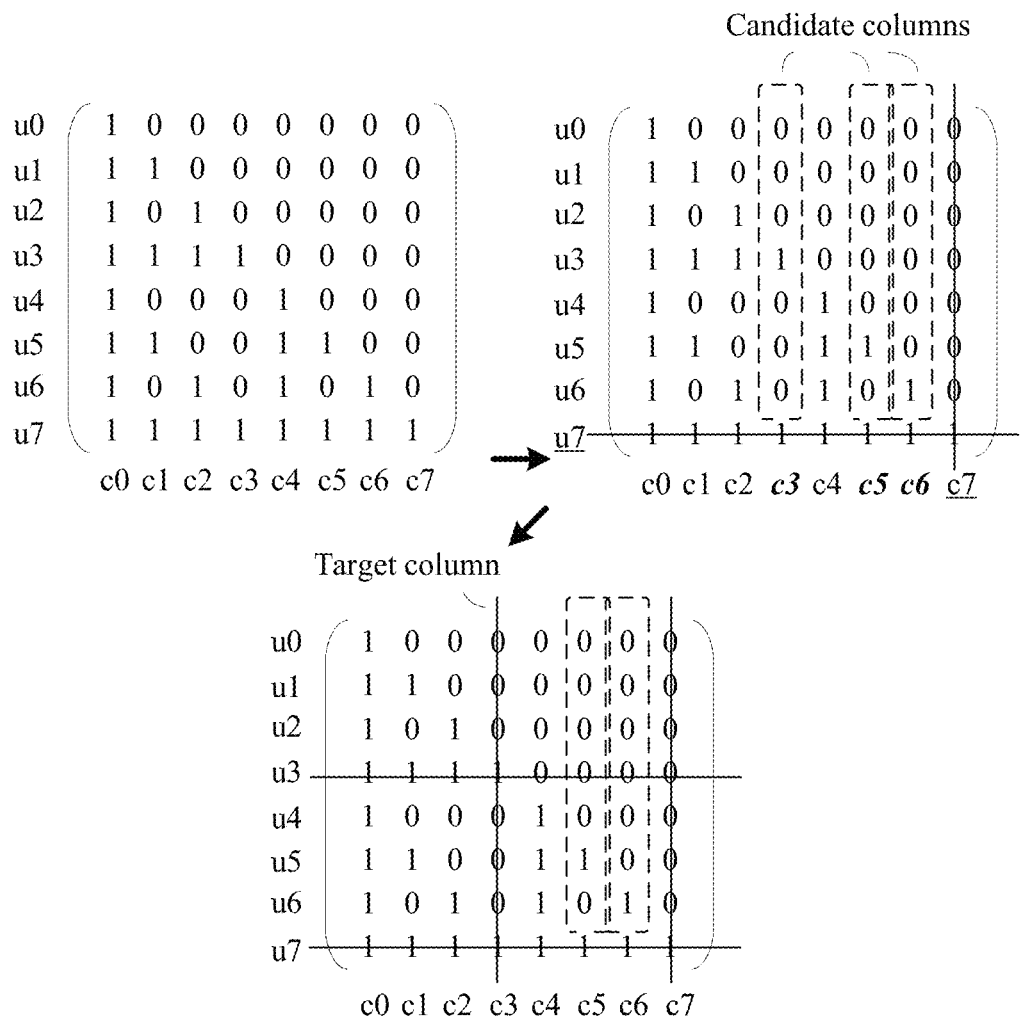
FIG. 6 is a schematic diagram of a rate matching method for a polar code according to still another embodiment of this application.

The following clearly describes the technical solutions in the embodiments of this application with reference to the accompanying drawings in the embodiments of this application.

The embodiments of this application may be applied to various communications systems, and therefore, the following description is not limited to a particular communications system, including a Global System for Mobile Communications (GSM) system, a Code Division Multiple Access (CDMA) system, a Wideband Code Division Multiple Access (CDMA) system, a general packet radio service (GPRS), a Long Term Evolution (LTE) system, an LTE frequency division duplex (FDD) system, LTE time division duplex (TDD) system, a Universal Mobile Telecommunications System (UMTS), or the like. Information or data encoded by a base station or a terminal by using a conventional Turbo code or LDPC code in the foregoing system may be encoded by using a polar code in the embodiments of this application. To improve performance of a polar code when implementing encoding and rate matching of a polar code of any code length, the embodiments of this application provide a rate matching method for a polar code, which can improve the performance of the polar code.

FIG. 2 is a schematic flowchart of a rate matching method for a polar code according to an embodiment of this application. As shown in FIG. 2, a method 200 includes the following steps.

S201. Encode, based on an N*N encoding matrix of a polar code, a sequence including N first bits, to generate a mother code including N second bits, where the N first bits are in a one-to-one correspondence with N rows in the encoding matrix in sequence, the N second bits are in a one-to-one correspondence with N columns in the encoding matrix in sequence, M and N are positive integers greater than 1, and N is greater than M.

In this embodiment of this application, the N*N encoding matrix may be represented by $G_N$, the sequence including N first bits may be a binary row vector $u_1^N = (u_1, u_2, \ldots, u_N)$, the mother code may be represented by $c_1^N$, and $c_1^N = u_1^N G_N$. Optionally, $G_N = F_2^{\otimes(\log_2(N))}$, or $G_N = B_N F_2^{\otimes(\log_2(N))}$, where $$F_2 = \begin{bmatrix} 1 & 0 \\ 1 & 1 \end{bmatrix},$$

$F_2^{\otimes(\log_2(N))}$ represents a Kronecker product of $\log_2 N$ matrices $F_2$, and $B_N$ is a bit-reversal permutation matrix. For example, $B_N$ may be an N*N matrix obtained after bit-reversal permutation is performed on columns in an N*N identity matrix.

It should be understood that the first bits may be understood as to-be-coded bits of the polar code, and the second bits may be understood as coded bits of the polar code.

The N first bits (or the N rows in the encoding matrix) are in a one-to-one correspondence with N polarized channels, and the polarized channels are used for placing the corresponding first bits. Reliability of the N polarized channels may be calculated. Generally, a fixed bit is placed on a polarized channel with relatively low reliability, and an information bit is placed on a channel with relatively high reliability, to ensure stable performance of the polar code. Common measurements of reliability include an error probability, a channel capacity, a polarization weight, and the like. Methods for calculating reliability of a polarized channel may include density evolution, Gaussian approximation, linear fitting, and the like.

S202. Determine N−M to-be-punctured second bits from the N second bits, where at least one first bit in N−M first bits participating in encoding of the N−M second bits belongs to the first M first bits in the N first bits, and the N−M first bits are fixed bits.

Specifically, the N−M first bits participating in the encoding of the N−M second bits may be determined in the following manner: The N−M second bits correspond to N−M target columns in the encoding matrix, and rows in which elements whose values are 1 in the N−M target columns are located are N−M target rows, where at least one target row in the N−M target rows belongs to the first M rows in the N rows, and N−M first bits corresponding to the N−M target rows are the N−M first bits participating in the encoding of the N−M second bits. That the N−M first bits are fixed bits may indicate that the N−M first bits corresponding to the N−M target rows are fixed bits, or may indicate that polarized channels corresponding to the N−M target rows are used for placing fixed bits in the first bits.

The N−M target rows may be rows in which elements whose values are 1 in elements in columns in the N−M columns that are in a one-to-one correspondence with the N−M to-be-punctured second bits in the encoding matrix are located. For example, as shown in FIG. 1, when the N−M target columns are c5, c6, and c7, the corresponding N−M target rows are rows corresponding to u5, u6, and u7. Generally, when the encoding matrix is $G_N = F_2^{\otimes(\log_2(N))}$, a row whose sequence number is larger in the encoding matrix corresponds to a polarized channel with higher reliability. In the prior art, in a shortening-based rate matching method for a polar code, puncturing is usually performed in descending order of sequence numbers. Therefore, reliability of a polarized channel corresponding to a punctured second bit is relatively high. Because the polarized channel corresponding to the punctured second bit is used for placing a fixed bit in the N first bits, performance of the polar code may be unstable.

In this embodiment of this application, when a puncturing length of the polar code is N−M, the at least one first bit in the N−M first bits participating in the encoding of the N−M to-be-punctured second bits belongs to the first M first bits in the N first bits, and the N−M first bits are fixed bits, in other words, polarized channels that correspond to the last N−M rows in the encoding matrix and that have relatively high reliability can be used for placing information bits other than the fixed bits, to improve performance of the polar code.

Optionally, in this embodiment of this application, the fixed bits in the N first bits may be placed on the N−M polarized channels corresponding to the N−M target rows. In the remaining polarized channels, a polarized channel with high reliability may be selected for placing an information bit, and a fixed bit is placed in another position.

S203. Puncture the N−M second bits, to obtain a target polar code including M second bits.

In this embodiment of this application, the N−M to-be-punctured second bits in the mother code correspond to the N−M target columns in the encoding matrix. The elements whose values are 1 in the N−M target columns are located in the N−M target rows, at least one target row in the N−M target rows belongs to the first M rows in the N rows in the encoding matrix, and the first bits corresponding to the N−M target rows are fixed bits, so that the first bits corresponding to the last N−M rows in the encoding matrix may include the information bits other than the fixed bits, and performance of the polar code is improved.

Optionally, the method 200 may further include following steps.

S204. Send the target polar code.

Optionally, the N−M to-be-punctured second bits may be determined based on sequence numbers of the N second bits. For example, the N−M to-be-punctured second bits may be determined based on a sequence obtained after bit-reversal permutation is performed on the sequence numbers of the N second bits. The following describes a method for determining the N−M to-be-punctured second bits based on the sequence numbers of the N second bits.

Optionally, in an embodiment, sequence numbers of the N−M second bits are the same as values of elements in a second sequence, the second sequence is a sequence obtained by sequentially calculating bit-reversal values of values of elements in a first sequence, and the first sequence is $$\left(\underbrace{M, M+1, \ldots, N-1}_{N-M}\right).$$

Optionally, the first sequence may be understood as sequence numbers of the last N−M second bits in the N second bits.

For example, FIG. 3 is a schematic diagram of a rate matching method for a polar code according to an embodiment of this application. An encoding matrix shown in FIG. 3 is used as an example. Assuming that a code length of a mother code is 8 (N=8), and a target code length is 5 (M=5), a first sequence is (5, 6, 7), and binary numbers of the first sequence are expressed as (101, 110, 111). Bit-reversal permutation is performed on the binary numbers of values of elements in the first sequence, to obtain binary numbers of a second sequence that are expressed as (101, 011, 111). Then, decimal numbers of the second sequence are expressed as (5, 3, 7). Assuming that sequence numbers of second bits start from 0, it can be determined based on the second sequence that three to-be-punctured second bits are c3, c5, and c7. Therefore, first bits u3, u5, and u7 participating in encoding of c3, c5, and c7 may be set as fixed bits. Rows corresponding to u3, u5, and u7 are rows in which elements whose values are 1 in columns corresponding to c3, c5, and c7 are located.

Optionally, in an embodiment, when the encoding matrix is $G_N = F_2^{\otimes(\log_2(N))}$, sequence numbers of the N−M second bits are the same as sequence numbers of the first N−M elements whose values are in descending order in a fourth sequence, the fourth sequence is a sequence obtained by sequentially calculating bit-reversal values of values of elements in a third sequence, and the third sequence is $$\left(\underbrace{0, 1, \ldots, N-1}_{N}\right).$$

Optionally, the third sequence may also be understood as sequence numbers of the N second bits.

For example, the encoding matrix in FIG. 3 is used as an example. In FIG. 3, the length of the mother code is 8, the length of the target polar code is 5, u0 to u7 indicate first bits corresponding to rows in the encoding matrix, and c0 to c7 indicate the 8-bit mother code generated after encoding. A third sequence in FIG. 3 is (0, 1, 2, 3, 4, 5, 6, 7), and binary numbers of the third sequence are expressed as (000, 001, 010, 011, 100, 101, 110, 111). Bit-reversal permutation is performed on the binary numbers of values of elements in the third sequence, to obtain binary numbers of a fourth sequence that are expressed as (000, 100, 010, 110, 001, 101, 011, 111). Therefore, decimal numbers of the fourth sequence are expressed as (0, 4, 2, 6, 1, 5, 3, 7). It is assumed that sequence numbers of sequences in this application start from 0. Sequence numbers of the first three elements 7, 6, and 5 whose values are in descending order in the fourth sequence are 7, 3, and 5. Therefore, the to-be-punctured second bits are c3, c5, and c7, and first bits u3, u5, and u7 participating in encoding of c3, c5, and c7 may be set as fixed bits. Rows corresponding to u3, u5, and u7 are rows in which elements whose values are 1 in columns corresponding to c3, c5, and c7 are located.

Alternatively, it can be learned from the fourth sequence that the sequence numbers of the N−M to-be-punctured second bits are the same as values of the last N−M elements in the fourth sequence.

Optionally, in an embodiment, when the encoding matrix is $G_N = F_2^{\otimes(\log_2(N))}$, sequence numbers of the N−M second bits are the same as sequence numbers of elements whose values are 0 in a second auxiliary sequence $p_0^{N-1}$, where the second auxiliary sequence $p_0^{N-1}$ and a first auxiliary sequence $$q_0^{N-1} = (\underbrace{1, 1, \ldots, 1}_{M}, \underbrace{0, 0, \ldots, 0}_{N-M})$$

meet a formula $p_i = p_{D(b_{n-1}b_{n-2} \ldots b_0)} = q_{D(b_0 b_1 \ldots b_{n-1})}$, $0 \leq i \leq N-1$, $b_j$ is a binary number, $p_i$ represents a value of an $i^{th}$ element in the second auxiliary sequence, $i = D(b_{n-1}b_{n-2} \ldots b_0)$, $D(b_{n-1}b_{n-2} \ldots b_0)$ indicates that a binary sequence $b_{n-1}b_{n-2} \ldots b_0$ is converted into decimal numbers, in other words, $$D(b_{n-1}b_{n-2} \ldots b_0) = \sum_{j=0}^{n-1} b_j \cdot 2^j,$$

where a relationship between N and n is $N=2^n$. For example, the encoding matrix shown in FIG. 3 is still used as an example. The first auxiliary sequence is $q_0^7 = (11111000)$, where values of the first five elements are 1, and values of the last three elements are 0. Based on the formula $p_i = p_{D(b_{n-1}b_{n-2} \ldots b_0)} = q_{D(b_0 b_1 \ldots b_{n-1})}$, the second auxiliary sequence is obtained.

Specifically, it is assumed that sequence numbers of sequences start from 0. For example, the third value in the first auxiliary sequence is 1, and a binary expression of 3 is 011. After bit-reversal permutation is performed on 011, a binary number 110 is obtained. The binary number 110 is converted into a decimal number 6. Then, it indicates that the third value in the first auxiliary sequence is the same as the sixth value in the second auxiliary sequence, in other words, the sixth value in the second auxiliary sequence is 1. According to the foregoing method, the second auxiliary sequence $q_0^7=(11111000) \Rightarrow p_0^7=(11101010)$ is obtained. Based on the elements whose values are 0 in the second auxiliary sequence, it can be determined that three to-be-punctured second bits are c3, c5, and c7, and therefore first bits u3, u5, and u7 corresponding to c3, c5, and c7 may be set as fixed bits. Rows corresponding to u3, u5, and u7 are rows in which elements whose values are 1 in columns corresponding to c3, c5, and c7 are located.

Optionally, in an embodiment, the method 200 may further include: when the encoding matrix is $G_N=B_N F_2^{\otimes(log_2(N))}$, the N−M second bits are in a one-to-one correspondence with the last N−M columns in the encoding matrix, and $B_N$ is a bit-reversal permutation matrix. For example, $B_N$ may be a matrix obtained after bit-reversal permutation is performed on N columns in an N*N identity matrix.

For example, FIG. 4 shows a method for determining a bit-reversal permutation matrix $B_N$ according to an embodiment of this application. An identity matrix in FIG. 4 is an 8*8 matrix, an $m^{th}$ column in the identity matrix is the same as an $n^{th}$ column in $B_N$, and a numerical value obtained after bit-reversal permutation is performed on a binary number of m is equal to n. In other words, an $m^{th}$ column in $G_N$ is the same as an $n^{th}$ column in $F_2^{\otimes(log_2(N))}$, where N−1≥m, and n≥0.

For example, FIG. 5 is a schematic diagram of a rate matching method for a polar code according to another embodiment of this application. An encoding matrix shown in FIG. 5 is an encoding matrix obtained after bit-reversal permutation is performed on the encoding matrix in FIG. 3. The bit-reversal permutation is performed in an encoding process, and therefore in FIG. 5, second bits corresponding to the last N−M columns (in FIG. 5, N=8, M=5, and N−M=3) in the encoding matrix may be directly selected as to-be-punctured second bits, and first bits u3, u5, and u7 participating in encoding of the to-be-punctured second bits c5, c6, and c7 may be set as fixed bits. Rows corresponding to u3, u5, and u7 are rows in which elements whose values are 1 in columns corresponding to c5, c6, and c7 are located.

Optionally, in an embodiment, in the method 200, when the encoding matrix is $G_N=F_2^{\otimes(log_2(N))}$, the N−M second bits are sequentially determined based on N−M rounds of operations. The first round of operation in the N−M rounds of operations includes: determining a second bit corresponding to an $N^{th}$ column in the N columns as a to-be-punctured second bit. The $(j+1)^{th}$ round of operation in the N−M rounds of operations includes: determining an (N−j)*(N−j) auxiliary encoding matrix, where the auxiliary encoding matrix is a matrix obtained after rows and columns corresponding to to-be-punctured second bits determined in the first j rounds are deleted from the encoding matrix, and 1≤j≤N−M−1; determining candidate columns from N−j columns in the auxiliary encoding matrix, where the candidate column includes only one element whose value is 1; determining a target column from the candidate columns; and determining a second bit corresponding to the target column as the to-be-punctured second bit.

The (N−j)*(N−j) auxiliary encoding matrix is the matrix obtained after the rows and the columns corresponding to the to-be-punctured second bits determined in the first j rounds are deleted from the encoding matrix. The column corresponds to the to-be-punctured second bit may be a column that is in the encoding matrix and that corresponds to the to-be-punctured second bit, and the row corresponding to the to-be-punctured second bit may be a row in which an element whose value is 1 in the column corresponding to the to-be-punctured second bit is located.

Optionally, in the method 200, the determining a target column from the candidate columns includes: determining a candidate column whose sequence number is the smallest in the candidate columns as the target column.

In this embodiment of this application, generally, a polarized channel corresponding to a column whose sequence number is smaller in the encoding matrix has lower reliability. During puncturing, a second bit corresponding to a candidate column whose sequence number is small is selected as the to-be-punctured second bit, a fixed bit is placed on a corresponding polarized channel, and an information bit is placed on another channel with relatively high reliability, to improve performance of the polar code. The polarized channel corresponding to the column may be a polarized channel corresponding to a row in which an element whose value is 1 in each column in the encoding matrix is located. For the candidate columns, each candidate column includes only one element whose value is 1, and therefore each candidate column corresponds to only one polarized channel.

Optionally, in the method 200, the determining a target column from the candidate columns includes: determining a code weight of a row corresponding to each of the candidate columns, where the row corresponding to each candidate column is a row in which an element whose value is 1 in each candidate column is located; and determining a candidate column corresponding to a row whose code weight is the smallest in the candidate columns as the target column.

It should be understood that the code weight of a row refers to a quantity of elements whose values are 1 in the row.

Optionally, in the method 200, the determining a target column from the candidate columns includes: determining a polarization weight of a row corresponding to each of the candidate columns, where the row corresponding to each candidate column is a row in which an element whose value is 1 in each candidate column is located; and determining a candidate column corresponding to a row whose polarization weight is the smallest in the candidate columns as the target column. The polarization weight corresponding to a row may also be a polarization weight corresponding to a corresponding polarized channel (to be specific, a polarized channel corresponding to the row corresponding to the candidate column). The polarization weight may be a measurement method of reliability. The polarization weight may be defined by using the following formula:

$$W_i = \sum_{j=0}^{n-1} b_j \cdot 2^{\frac{1}{4}j},$$

where 0≤i≤N−1, N=$2^n$, i=D($b_{n-1}b_{n-2} \ldots b_0$), and $b_j$ is a binary number.

In the foregoing formula, $W_i$ represents a polarization weight, i represents an index of a polarized channel, i=D($b_{n-1}b_{n-2} \ldots b_0$) that is a binary expression of i, $b_{n-1}$ is a most significant bit, $b_0$ is a least significant bit, $b_j \in \{0,1\}$ and n is a positive integer.

Figure 7:
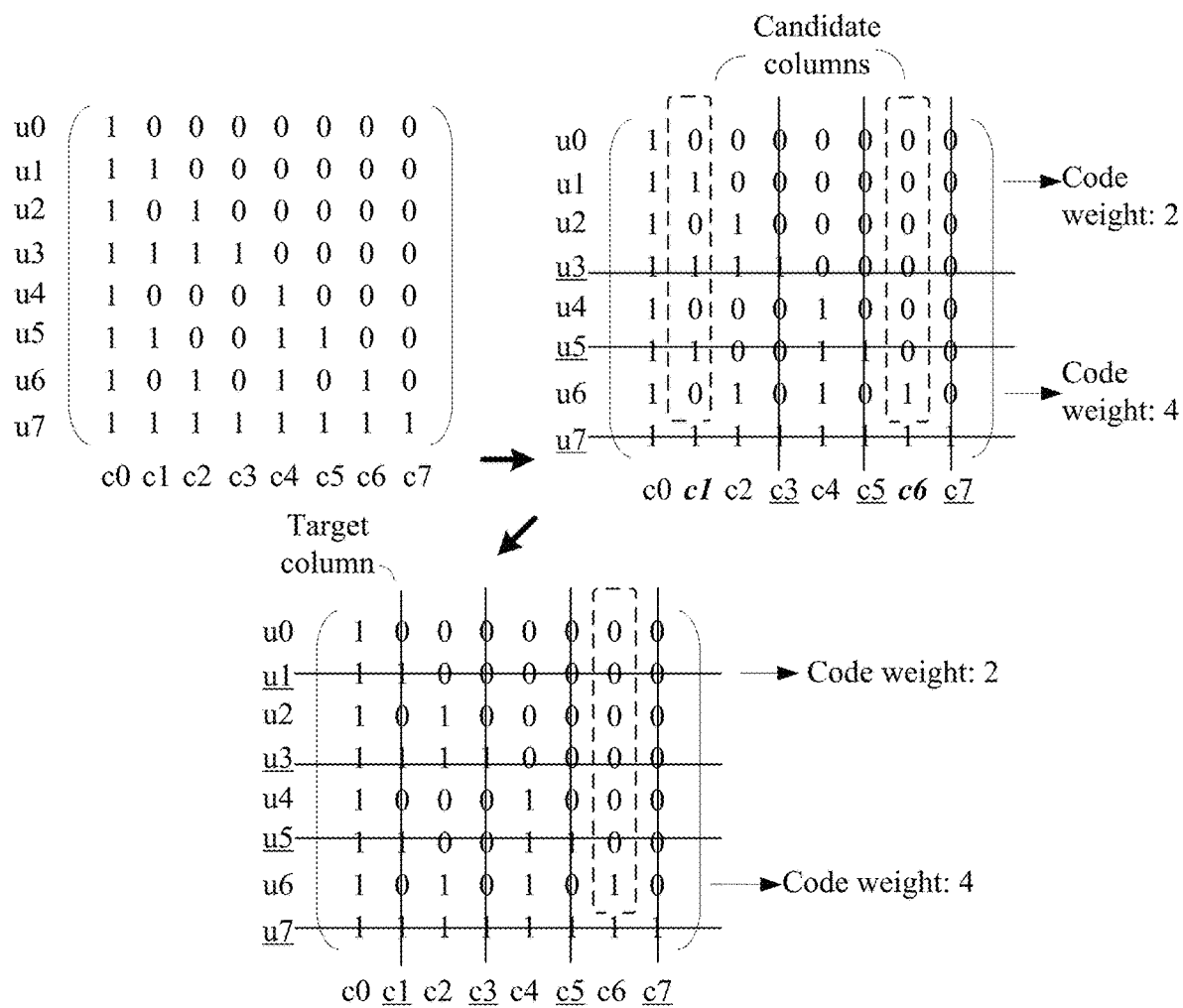
FIG. 7 is a schematic diagram of a rate matching method for a polar code according to yet another embodiment of this application.
Figures 8, 9:
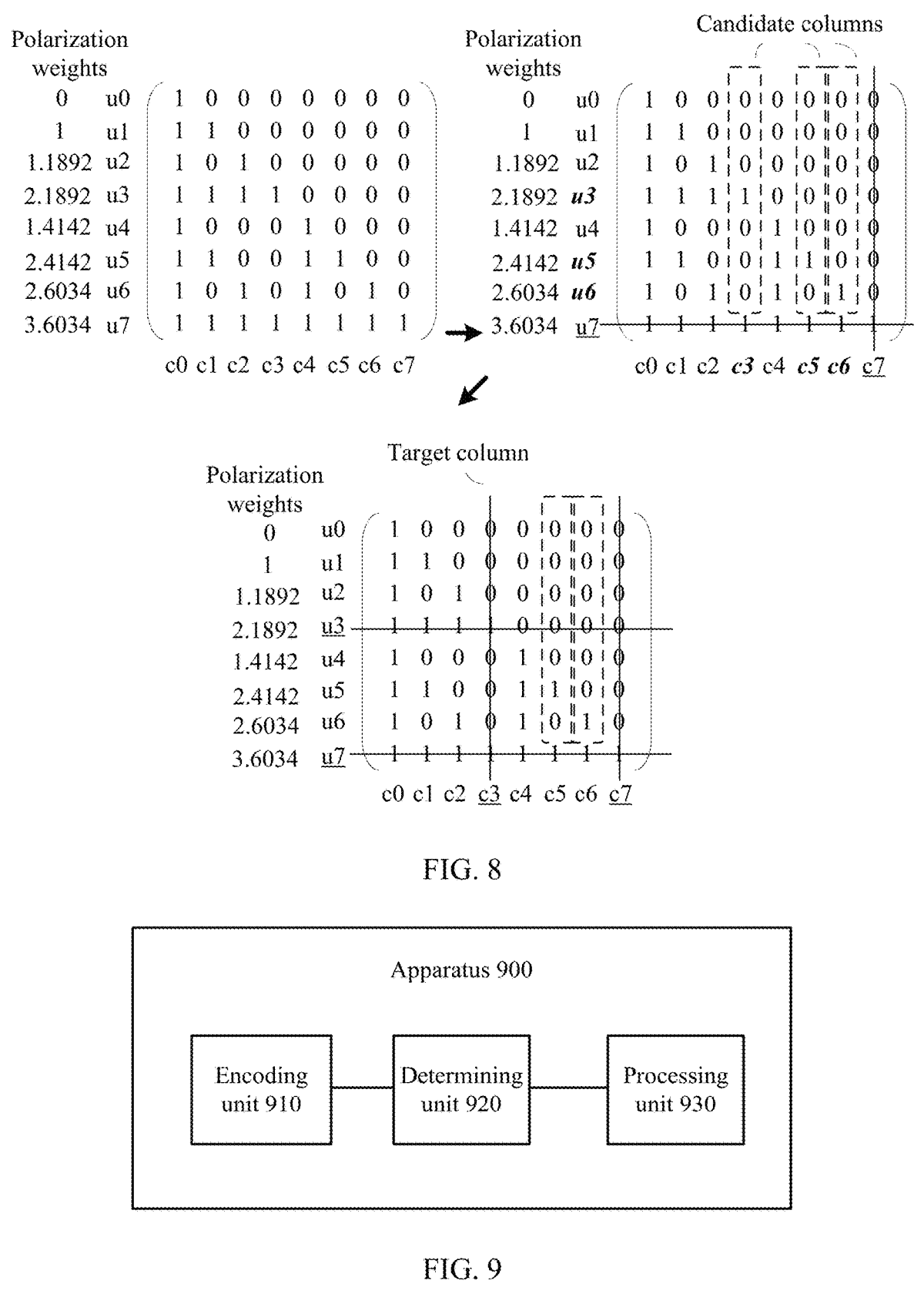

With reference to FIG. 6 to FIG. 8, the following uses examples to describe the method for determining the N−M to-be-punctured second bits based on the N−M rounds of operations. FIG. 6 is a schematic diagram of a rate matching method for a polar code according to another embodiment of this application, and shows a method for determining a puncturing pattern based on a position of a column corresponding to a second bit. All encoding matrices $G_N$ in FIG. 6 to FIG. 8 meet the formula $G_N = F_2^{\otimes(log_2(N))}$.

An encoding matrix shown in FIG. 6 is an 8*8 matrix. It is assumed that a code length of a mother code is 8 (N=8), and a target code length is 6 (M=6), where u0 to u7 indicate first bits corresponding to rows in the encoding matrix, and c0 to c7 indicate an 8-bit mother code generated after encoding. First bits related to punctured bits include only fixed bits based on a requirement of a shortening mode. From the perspective of the encoding matrix, a column corresponding to a to-be-punctured second bit is a column including only one "1" in the encoding matrix. The encoding matrix $G_N = F_2^{\otimes(log_2(N))}$ is a lower triangular matrix, and therefore, a to-be-punctured second bit in the first round of operation is definitely the last second bit (c7). In the second round of operation, a row and a column corresponding to c7 in the encoding matrix are deleted, to be specific, the last row and the last column are deleted from the encoding matrix, to obtain a 7*7 auxiliary encoding matrix in the second round of operation. Columns including only one "1" in the auxiliary encoding matrix are selected as candidate columns based on a puncturing requirement. A column whose sequence number is the smallest is selected from the candidate columns as a next to-be-punctured second bit. In the second round of operation, candidate columns are columns corresponding to c3, c5, and c6. Therefore, a column corresponding to c3 is selected as a target column, in other words, c3 is determined as a to-be-punctured second bit in the second round of operation. A plurality of rounds of operations may be performed until the polar code reaches the target code length.

FIG. 7 is a schematic diagram of a rate matching method for a polar code according to another embodiment of this application, and shows a method for determining a puncturing pattern based on code weights of rows in an encoding matrix.

An encoding matrix shown in FIG. 7 is an 8*8 matrix. It is assumed that a code length of a mother code is 8 (N=8), and a target code length is 4 (M=4), where u0 to u7 indicate first bits corresponding to rows in the encoding matrix, and c0 to c7 indicate an 8-bit mother code generated after encoding. In the method shown in FIG. 7, for content same as or similar to that in the method in FIG. 6, refer to related descriptions in FIG. 6. Details are not described herein again. Based on a puncturing requirement, in the first round of operation, a to-be-punctured second bit is determined as a second bit (c7) corresponding to the last column. In the second round of operation, code weights of rows in which elements whose values are 1 in columns corresponding to candidate columns c3, c5, and c6 are located are all 4, and therefore c3 whose sequence number is smaller may be selected as a to-be-punctured second bit. In the third round of operation, code weights of rows in which "1" in columns corresponding to the candidate columns c5 and c6 is located are both 4, and therefore c5 whose sequence number is smaller may be selected as a to-be-punctured second bit. As shown in FIG. 7, in the fourth round of operation, candidate columns are columns corresponding to c1 and c6. A code weight of a row in which "1" in a column corresponding to c1 is located is 2, and a code weight of the row in which "1" in the column corresponding to c6 is located is 4. Therefore, c1 is selected as a to-be-punctured second bit. Then, u1, u3, u5, and u7 may be set as fixed bits, and an information bit or a fixed bit may be placed on another first bit based on reliability of a polarized channel.

FIG. 8 is a schematic diagram of a rate matching method for a polar code according to another embodiment of this application, and shows a method for determining a puncturing pattern based on polarization weights of rows in an encoding matrix.

An encoding matrix shown in FIG. 8 is an 8*8 matrix. It is assumed that a code length of a mother code is 8 (N=8), and a target code length is 6 (M=6), where u0 to u7 indicate first bits corresponding to rows in the encoding matrix, and c0 to c7 indicate an 8-bit mother code generated after encoding. In the method shown in FIG. 8, for content same as or similar to that in the method in FIG. 6 or FIG. 7, refer to related descriptions in FIG. 6 or FIG. 7. Details are not described herein again. Based on a puncturing requirement, in the first round of operation, a to-be-punctured second bit is determined as a second bit (c7) corresponding to the last column. In the second round of operation, after a 7*7 auxiliary encoding matrix is determined, it is determined that candidate columns are columns corresponding to c3, c5, and c6. It can be learned from FIG. 8 that polarization weights corresponding to the rows in the encoding matrix are sequentially (0, 1, 1.1892, 2.1892, 1.4142, 2.04142, 2.6034, 3.6034). It can be seen that in the candidate columns, a polarization weight of a row in which an element whose value is 1 in a column corresponding to c3 is located is the smallest, and c3 may be selected as a to-be-punctured second bit. Therefore, first bits u3 and u7 corresponding to c3 and c7 may be set as fixed bits, and another first bit may be set as an information bit or a fixed bit based on reliability of a corresponding polarized channel.

In this embodiment of this application, when a puncturing length of the polar code is N−M, the at least one first bit in the N−M first bits participating in the encoding of the N−M to-be-punctured second bits belongs to the first M first bits in the N first bits, and the N−M first bits are fixed bits, in other words, information bits other than the fixed bits may be placed on polarized channels that correspond to the last N−M rows in the encoding matrix and that have relatively high reliability, to improve performance of the polar code.

Figure 10:
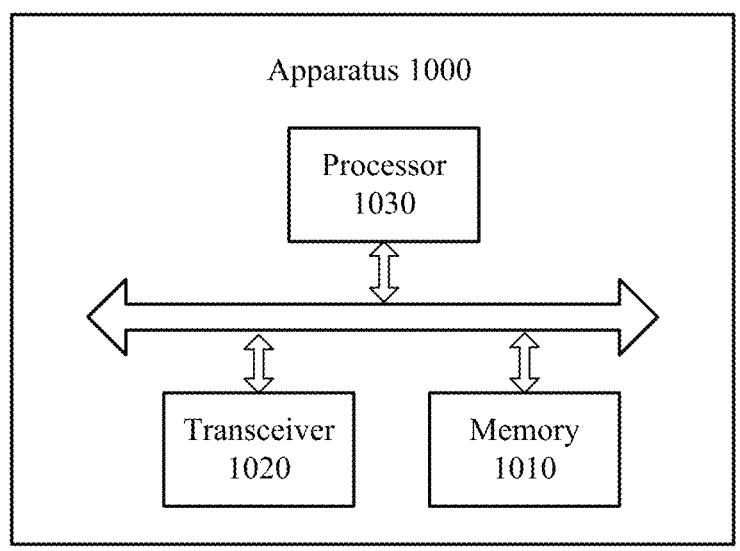
FIG. 10 is a schematic block diagram of an apparatus according to another embodiment of this application.

The rate matching method for a polar code in the embodiments of this application are described in detail above with reference to FIG. 1 to FIG. 8, and the following describes an apparatus in the embodiments of this application with reference to FIG. 9 and FIG. 10.

FIG. 9 is a schematic diagram of an apparatus 900 according to an embodiment of this application. It should be understood that the apparatus 900 in FIG. 9 can implement steps of the rate matching method for a polar code in FIG. 1 to FIG. 8. For brevity, repeated descriptions are omitted to some extent. The apparatus 900 may be a sending device, and the apparatus 900 includes an encoding unit 910, a determining unit 920, and a processing unit 930.

The encoding unit 910 is configured to encode, based on an N*N encoding matrix of a polar code, a sequence including N first bits, to generate a mother code including N second bits, where the N first bits are in a one-to-one correspondence with N rows in the encoding matrix in sequence, and the N second bits are in a one-to-one correspondence with N columns in the encoding matrix in sequence.

The determining unit 920 is configured to determine N−M to-be-punctured second bits from the N second bits, where at least one first bit in N−M first bits participating in encoding of the N−M second bits belongs to the first M first bits in the N first bits, and the N−M first bits are fixed bits.

The processing unit 930 is configured to puncture the N−M second bits, to obtain a target polar code including M second bits.

In this embodiment of this application, when a puncturing length of the polar code is N−M, the at least one first bit in the N−M first bits participating in the encoding of the N−M to-be-punctured second bits belongs to the first M first bits in the N first bits, and the N−M first bits are fixed bits, in other words, information bits other than the fixed bits may be placed on polarized channels that correspond to the last N−M rows in the encoding matrix and that have relatively high reliability, to improve performance of the polar code.

FIG. 10 is a schematic diagram of an apparatus 1000 according to an embodiment of this application. It should be understood that the apparatus 1000 in FIG. 10 can implement steps of the rate matching method for a polar code in FIG. 1 to FIG. 8. For brevity, repeated descriptions are omitted to some extent. The apparatus 1000 may be a sending device, and the apparatus 1000 includes a memory 1010, a transceiver 1020, and a processor 1030.

The memory 1010 is configured to store a program.

The transceiver 1020 is configured to communicate with another device.

The processor 1030 is configured to execute the program stored in the memory 1010, and when the program is executed, the processor 1030 is configured to: encode, based on an N*N encoding matrix of a polar code, a sequence including N first bits, to generate a mother code including N second bits, where the N first bits are in a one-to-one correspondence with N rows in the encoding matrix in sequence, and the N second bits are in a one-to-one correspondence with N columns in the encoding matrix in sequence determine N−M to-be-punctured second bits from the N second bits, where at least one first bit in N−M first bits participating in encoding of the N−M second bits belongs to the first M first bits in the N first bits, and the N−M first bits are fixed bits; and puncture the N−M second bits, to obtain a target polar code including M second bits.

In this embodiment of this application, when a puncturing length of the polar code is N−M, the at least one first bit in the N−M first bits participating in the encoding of the N−M to-be-punctured second bits belongs to the first M first bits in the N first bits, and the N−M first bits are fixed bits, in other words, information bits other than the fixed bits may be placed on polarized channels that correspond to the last N−M rows in the encoding matrix and that have relatively high reliability, to improve performance of the polar code.

Optionally, the apparatus in this application may be a base station, a terminal device, a physical apparatus including functions of the base station, or a physical apparatus including functions of the terminal device. A base station (BS) in the embodiments of this application is an apparatus that is deployed in a radio access network and that is configured to provide a wireless communication function for UE. The base station may include a macro base station, a micro base station, a relay station, an access point, and the like in various forms. In systems using different radio access technologies, a device having functions of the base station may have different names, for example, is referred to as an evolved NodeB (eNB, or eNodeB) in an LTE network, and is referred to as a NodeB in a 3rd generation (3G) network. The terminal device in the embodiments of this application may include various handheld devices, in-vehicle devices, wearable devices, computing devices, or other processing devices connected to wireless modems; user equipment (UE), a mobile station (MS), a terminal, and a terminal device that are in various forms; and the like, where the foregoing devices have a wireless communication function.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of this application, "B corresponding to A" indicates that B is associated with A, and B may be determined according to A. However, it should further be understood that determining B according to A does not mean that B is determined according to A only and B may also be determined according to A and/or other information.

It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments in this application.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer readable storage medium. Based on such an understanding, the technical solutions of this application essentially, or the part contributing to the prior art, or all or some of the technical solutions may be implemented in the form of a software product. The software product is stored in a storage medium and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

This application further provides an embodiment implemented by a chip. A module included in the chip is configured to perform the method in any one of the foregoing embodiments.

This application further provides a computer readable storage medium. The computer readable storage medium stores an instruction, and when the instruction runs on an apparatus, the apparatus is configured to perform the method in any one of the foregoing embodiments.

For brevity and clarity of this application, it may be understood that technical features and descriptions in an embodiment above are applicable to another embodiment and are not repeatedly described in another embodiment.

The foregoing descriptions are merely specific embodiments of this application, but are not intended to limit the protection scope of this application. Any modification or replacement readily figured out by a person skilled in the art within the technical scope disclosed in this application shall fall within the protection scope of this application. Therefore, the protection scope of this application shall be subject to the protection scope of the claims.

What is claimed is:

1. A method comprising:
    encoding, by a first communication device, based on an N*N encoding matrix of a polar code, a sequence comprising N first bits to generate a mother code comprising N second bits, wherein the N first bits are in a one-to-one correspondence with N rows in the encoding matrix in sequence, and the N second bits are in a one-to-one correspondence with N columns in the encoding matrix in sequence;
    determining, by the first communication device, N−M to-be-punctured second bits from the N second bits, wherein at least one first bit in N−M first bits participating in encoding of the N−M second bits belongs to the first M first bits in the N first bits, and the N−M first bits are fixed bits;
    puncturing, by the first communication device, the N−M second bits, to obtain a target polar code comprising M second bits;
    obtaining encoded data, by the first communication device, by applying the target polar code to data to be encoded; and
    transmitting, by the first communication device, a signal with the encoded data to a second communication device.

2. The method according to claim 1, wherein the encoding matrix is $G_N$, $G_N = F_2^{\otimes(log_2(N))}$, $$F_2 = \begin{bmatrix} 1 & 0 \\ 1 & 1 \end{bmatrix},$$

and wherein $F_2^{\otimes(log_2(N))}$ represents a Kronecker product of $log_2 N$ matrices $F_2$.

3. The method according to claim 2, wherein sequence numbers of the N−M second bits are the same as values of elements in a second sequence, wherein a second sequence is a sequence of bit-reversal values of values of elements in a first sequence, and wherein the first sequence is $$\underbrace{(M, M+1, \cdots, N-1)}_{N-M}.$$

4. The method according to claim 2, wherein sequence numbers of the N−M second bits are the same as sequence numbers of the first N−M elements whose values are in descending order in a fourth sequence, the fourth sequence being a sequence of bit-reversal values of values of elements in a third sequence, and the third sequence being $$\underbrace{(0, 1, \cdots, N-1)}_{N}.$$

5. The method according to claim 2, wherein sequence numbers of the N−M second bits are the same as sequence numbers of elements whose values are o in a second auxiliary sequence $p_0^{N-1}$, the second auxiliary sequence $p_0^{N-1}$ and a first auxiliary sequence $$q_0^{N-1} = (\underbrace{1, 1, \cdots, 1}_{M}, \underbrace{0, 0, \cdots, 0}_{N-M})$$

meeting a formula $p_i = p_{D(b_{n-1}b_{n-2} \cdots b_0)} = q_{D(b_0 b_1 \cdots b_{n-1})}$, with $p_i$ representing a value of an $i^{th}$ element in the second auxiliary sequence, $i = D(b_{n-1}b_{n-2} \cdots b_o)$, $$D(b_{n-1}b_{n-2} \ldots b_0) = \sum_{j=0}^{n-1} b_j \cdot 2^j,$$

o≤i≤N−1, N=$2^n$, and $b_j$ being a binary number.

6. The method according to claim 2,
    wherein the N−M second bits are sequentially determined based on N−M rounds of operations,
    wherein a first round of operation in the N−M rounds of operations comprises determining a second bit corresponding to an $N^{th}$ column in the N columns as a to-be-punctured second bit, and wherein a $(j+1)^{th}$ round of operation in the N−M rounds of operations comprises:
determining an (N−j)*(N−j) auxiliary encoding matrix, wherein the auxiliary encoding matrix is a matrix obtained after rows and columns corresponding to to-be-punctured second bits determined in the first j rounds are deleted from the encoding matrix, and 1≤j≤N−M−1,
determining candidate columns from N−j columns in the auxiliary encoding matrix, wherein each of the candidate column comprises only one element whose value is 1,
determining a target column from the candidate columns, and
determining a second bit corresponding to the target column as the to-be-punctured second bit.

7. The method according to claim 6, wherein determining the target column from the candidate columns comprises:
determining a candidate column whose sequence number is the smallest in the candidate columns as the target column; or
determining a code weight of a row corresponding to each of the candidate columns, wherein the row corresponding to each candidate column is a row in which an element whose value is 1 in each candidate column is located, and determining a candidate column corresponding to a row whose code weight is the smallest in the candidate columns as the target column; or
determining a polarization weight of a row corresponding to each of the candidate columns, wherein the row corresponding to each candidate column is a row in which an element whose value is 1 in each candidate column is located, and determining a candidate column corresponding to a row whose polarization weight is the smallest in the candidate columns as the target column.

8. The method according to claim 1, wherein the encoding matrix is $G_N$, $G_N = B_N F_2^{\otimes (log_2(N))}$, $$F_2 = \begin{bmatrix} 1 & 0 \\ 1 & 1 \end{bmatrix},$$

and wherein $F_2^{\otimes (log_2(N))}$ represents a Kronecker product of $log_2 N$ matrices $F_2$, $B_N$ is a bit-reversal permutation matrix, and the N−M second bits are in a one-to-one correspondence with the last N−M columns in the encoding matrix.

9. An communication apparatus comprising:
a memory configured to store a program;
a processor configured to execute the program stored in the memory and cause the apparatus to:
encode, based on an N*N encoding matrix of a polar code, a sequence comprising N first bits to generate a mother code comprising N second bits, wherein the N first bits are in a one-to-one correspondence with N rows in the encoding matrix in sequence, and the N second bits are in a one-to-one correspondence with N columns in the encoding matrix in sequence,
determine N−M to-be-punctured second bits from the N second bits, wherein at least one first bit in N−M first bits participating in encoding of the N−M second bits belongs to the first M first bits in the N first bits, and the N−M first bits are fixed bits, and
puncture the N−M second bits, to obtain a target polar code comprising M second bits, wherein the processor is further configured to:
obtain encoded data by applying the target polar code to data to be encoded; and
a transceiver configured to transmit a signal with the encoded data to another communication device.

10. The communication apparatus according to claim 9, wherein the encoding matrix is $G_N$, $G_N = F_2^{\otimes (log_2(N))}$, $$F_2 = \begin{bmatrix} 1 & 0 \\ 1 & 1 \end{bmatrix},$$

and wherein $F_2^{\otimes (log_2(N))}$ represents a Kronecker product of $log_2 N$ matrices $F_2$.

11. The apparatus according to claim 10, wherein sequence numbers of the N−M second bits are the same as values of elements in a second sequence, wherein a second sequence is a sequence of bit-reversal values of values of elements in a first sequence, and wherein the first sequence is $$\underbrace{(M, M+1, \cdots, N-1)}_{N-M}.$$

12. The communication apparatus according to claim 10, wherein sequence numbers of the N−M second bits are the same as sequence numbers of the first N−M elements whose values are in descending order in a fourth sequence, the fourth sequence being a sequence of bit-reversal values of values of elements in a third sequence, and the third sequence being $$\underbrace{(0, 1, \cdots, N-1)}_{N}.$$

13. The communication apparatus according to claim 10, wherein sequence numbers of the N−M second bits are the same as sequence numbers of elements whose values are o in a second auxiliary sequence $p_0^{N-1}$, the second auxiliary sequence $p_0^{N-1}$ and a first auxiliary sequence $$q_0^{N-1} = (\underbrace{1,1,\cdots,1}_{M}, \underbrace{0,0,\cdots,0}_{N-M})$$

meeting a formula $p_i = p_{D(b_n b_{n-2} \ldots b_0)} = q_{D(b_0 b_1 \ldots b_{n-1})}$, with $p_i$ representing a value of an $i^{th}$ element in the second auxiliary sequence, $i = D(b_{n-1} b_{n-2} \ldots b_0)$, $$D(b_{n-1} b_{n-2} \ldots b_0) = \sum_{j=0}^{n-1} b_j \cdot 2^j,$$

$o \le i \le N-1$, $N = 2^n$, and $b_j$ being a binary number.

14. The communication apparatus according to claim 10, wherein the processor is configured to execute the program stored in the memory and cause the apparatus to:
sequentially determine the N−M second bits based on N−M rounds of operations,
wherein, for a first round of operation in the N−M rounds of operations, determine a second bit corresponding to an $N^{th}$ column in the N columns as a to-be-punctured second bit, and wherein, for a $(j+1)^{th}$ round of operation in the N−M rounds of operations, determine an (N−j)*(N−j) auxiliary encoding matrix, wherein the auxiliary encoding matrix is a matrix obtained after rows and columns corresponding to to-be-punctured second bits determined in the first j rounds are deleted from the encoding matrix, and 1≤j≤N−M−1, determine candidate columns from N—j columns in the auxiliary encoding matrix, wherein the candidate column comprises only one element whose value is 1, determine a target column from the candidate columns, and determine a second bit corresponding to the target column as the to-be-punctured second bit.

15. The communication apparatus according to claim 14, wherein determining the target column from the candidate columns comprises determining the target column by:

determine a candidate column whose sequence number is the smallest in the candidate columns as the target column; or determine a code weight of a row corresponding to each of the candidate columns, wherein the row corresponding to each candidate column is a row in which an element whose value is 1 in each candidate column is located, and determine a candidate column corresponding to a row whose code weight is the smallest in the candidate columns as the target column; or determine a polarization weight of a row corresponding to each of the candidate columns, wherein the row corresponding to each candidate column is a row in which an element whose value is 1 in each candidate column is located, and determine a candidate column corresponding to a row whose polarization weight is the smallest in the candidate columns as the target column.

16. The communication apparatus according to claim 9, wherein the encoding matrix is $G_N$, $G_N=B_N F_2^{\otimes(log_2(N))}$, $$F_2 = \begin{bmatrix} 1 & 0 \\ 1 & 1 \end{bmatrix},$$

and wherein $F_2^{\otimes(log_2(N))}$ represents a Kronecker product of $log_2$ N matrices $F_2$, $B_N$ is a bit-reversal permutation matrix, and the N−M second bits are in a one-to-one correspondence with the last N−M columns in the encoding matrix.

17. A non-transitory machine readable storage medium storing instructions which, when executed by an apparatus, causes the apparatus to:

encode, based on an N*N encoding matrix of a polar code, a sequence comprising N first bits to generate a mother code comprising N second bits, wherein the N first bits are in a one-to-one correspondence with N rows in the encoding matrix in sequence, and the N second bits are in a one-to-one correspondence with N columns in the encoding matrix in sequence;

determine N−M to-be-punctured second bits from the N second bits, wherein at least one first bit in N−M first bits participating in encoding of the N−M second bits belongs to the first M first bits in the N first bits, and the N−M first bits are fixed bits;

puncture the N−M second bits, to obtain a target polar code comprising M second bits obtain encoded data by applying the target polar code to data to be encoded; and transmit a signal with the encoded data to another communication device.

18. The non-transitory machine readable storage medium according to claim 17, wherein the encoding matrix is $G_N$, $G_N=F_2^{\otimes(log_2(N))}$, $$F_2 = \begin{bmatrix} 1 & 0 \\ 1 & 1 \end{bmatrix},$$

and wherein and $F_2^{\otimes(log_2(N))}$ represents a Kronecker product of $log_2$ N matrices $F_2$.

* * * * *